United States Patent
Ho (10) Patent No.: US 10,395,703 B2
(45) Date of Patent: Aug. 27, 2019

(54) COLUMN DECODER OF MEMORY DEVICE

(71) Applicant: Winbond Electronics Corp., Taichung (TW)

(72) Inventor: Wen-Chiao Ho, Taichung (TW)

(73) Assignee: Windbond Electronics Corp., Taichung (TW)

( * ) Notice: Subject to any disclaimer, the term of this patent is extended or adjusted under 35 U.S.C. 154(b) by 0 days.

(21) Appl. No.: 16/045,772

(22) Filed: Jul. 26, 2018

(65) Prior Publication Data

US 2019/0035444 A1    Jan. 31, 2019

(30) Foreign Application Priority Data

Jul. 28, 2017    (CN) .......................... 2017 1 0628795

(51) Int. Cl.
*G11C 8/00* (2006.01)
*G11C 8/10* (2006.01)
*G11C 7/10* (2006.01)

(52) U.S. Cl.
CPC .............. *G11C 8/10* (2013.01); *G11C 7/1012* (2013.01); *G11C 7/1006* (2013.01)

(58) Field of Classification Search
CPC ........................................................ G11C 8/10
USPC ....................................................... 365/230.06
See application file for complete search history.

(56) References Cited

U.S. PATENT DOCUMENTS

2007/0214335 A1*   9/2007   Bellows ............... G11C 7/1012
                                                                  711/167

\* cited by examiner

*Primary Examiner* — Hoai V Ho
(74) *Attorney, Agent, or Firm* — JCIPRNET (57) ABSTRACT

A column decoder of a memory device includes a first selection circuit, a second selection circuit and a decoding circuit. The first selection circuit and the second selection circuit are electrically connected in cascade with a memory array of the memory device. The decoding circuit receives a column address including a first sub-address and a second sub-address. The decoding circuit generates first decoded data and second decoded data for controlling the first selection circuit and the second selection circuit based on the first sub-address and the second sub-address. A first decoder in the decoding circuit decodes the first sub-address into the first decoded data, and the first decoded data is reversed in response to change of a first predetermined bit of the second sub-address.

11 Claims, 9 Drawing Sheets

| A2 | 0 | 1 |
|---|---|---|
| A1 | 0 0 1 1 | 0 0 1 1 |
| A0 | 0 1 0 1 | 0 1 0 1 |
| B1 | 0 0 1 1 | 1 1 0 0 |
| B0 | 0 1 0 1 | 1 0 1 0 |
| X3 | 0 0 0 1 | 1 0 0 0 |
| X2 | 0 0 1 0 | 0 1 0 0 |
| X1 | 0 1 0 0 | 0 0 1 0 |
| X0 | 1 0 0 0 | 0 0 0 1 |

| A2 | 0 | | | | 1 | | | |
|---|---|---|---|---|---|---|---|---|
| A1 | 0 | 0 | 1 | 1 | 0 | 0 | 1 | 1 |
| A0 | 0 | 1 | 0 | 1 | 0 | 1 | 0 | 1 |
| C1 | 1 | 1 | 0 | 0 | 0 | 0 | 1 | 1 |
| C0 | 1 | 0 | 1 | 0 | 0 | 1 | 0 | 1 |
| X3 | 0 | 0 | 0 | 1 | 1 | 0 | 0 | 0 |
| X2 | 0 | 0 | 1 | 0 | 0 | 1 | 0 | 0 |
| X1 | 0 | 1 | 0 | 0 | 0 | 0 | 1 | 0 |
| X0 | 1 | 0 | 0 | 0 | 0 | 0 | 0 | 1 |

COLUMN DECODER OF MEMORY DEVICE

CROSS-REFERENCE TO RELATED APPLICATION

This application claims the priority benefit of China application serial no. 201710628795.4, filed on Jul. 28, 2017. The entirety of the above-mentioned patent application is hereby incorporated by reference herein and made a part of this specification.

BACKGROUND

Field of the Invention

The invention relates a decoding technique of a memory device and more particularly, to a column decoder of a memory device.

Description of Related Art

Generally speaking, a memory device may select a memory cell in a memory array by a column decoder and a row decoder, so as to perform a reading operation, a verification operation or a programming operation on the selected memory cell. In addition, during a period that the reading operation, the verification operation or the programming operation is performed, a control logic circuit in the memory device successively accumulates a column address of the memory cell, so as to perform a corresponding operation on a predetermined block in the memory array.

A conventional column decoder may decode the column address into first decoded data to third decoded data, thereby controlling first to third selection circuits therein respectively. Additionally, during the process where the successively incremental column address is processed, multiple simultaneous transitions usually occur to the decoded data which is decoded by the conventional column decoder. For instance, taking the conventional column decoder as an example, during the process where the column address is gradually accumulated one by one from {000000} to {111111}, the number of times of the simultaneous transitions occurring to the first to the third decoded data is 4, and the number of times of the simultaneous transitions occurring to two of the first to the third decoded data is 12. However, in a scenario where states of the decoded data are changed simultaneously, it represents that more switches of the first to the third selection circuits are simultaneously switched. Thus, as the number of times of the simultaneous transitions occurring to the decoded data increases, it may result in more power switching loss, such that power consumption of the column decoder is increased, and a decoding speed of the column decoder is reduced. Moreover, it may cause the transitions of the decoded data to fail to be completed in a planned time, which leads to failure of the column decoder and reduction of reliability of the column decoder.

SUMMARY

The invention provides a column decoder of a memory device, in which a first decoder of a decoding circuit may decode a first sub-address into first decoded data based on a first predetermined bit of a second sub-address. Thereby, power consumption of the column decoder may be reduced, and a decoding speed and reliability of the column decoder may be increased.

A column decoder of a memory device of the invention includes a first selection circuit, a second selection circuit and a decoding circuit. The decoding circuit includes a first decoder. The first selection circuit and the second selection circuit are electrically connected in cascade with a memory array in the memory device. The decoding circuit is electrically connected to the first selection circuit and the second selection circuit and receives a column address including a first sub-address and a second sub-address. The decoding circuit generates first decoded data for controlling the first selection circuit based on the first sub-address and generates second decoded data for controlling the second selection circuit based on the second sub-address. The first decoder decodes the first sub-address into the first decoded data, and the first decoded data is reversed in response to a change of a first predetermined bit of the second sub-address.

In an embodiment of the invention, the column decoder of the memory device further includes a third selection circuit. The third selection circuit is electrically connected to the decoding circuit and electrically connected to the first selection circuit through the second selection circuit. The column address further includes a third sub-address, and the first predetermined bit is a least significant bit of the second sub-address. The decoding circuit further generates third decoded data for controlling the third selection circuit based on the third sub-address. The decoding circuit further includes a second decoder and a third decoder. The second decoder decodes the second sub-address into the second decoded data. The third decoder decodes the third sub-address into the third decoded data.

Based on the above, the decoding circuit of the column decoder of the invention can receive the column address including the first sub-address and the second sub-address. In addition, the first decoder of the decoding circuit can decode the first sub-address into the first decoded data, and the first decoded data is reversed in response to the change of the first predetermined bit of the second sub-address. Thereby, the power consumption of the column decoder can be reduced, and the decoding speed and the reliability of the column decoder can be increased.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
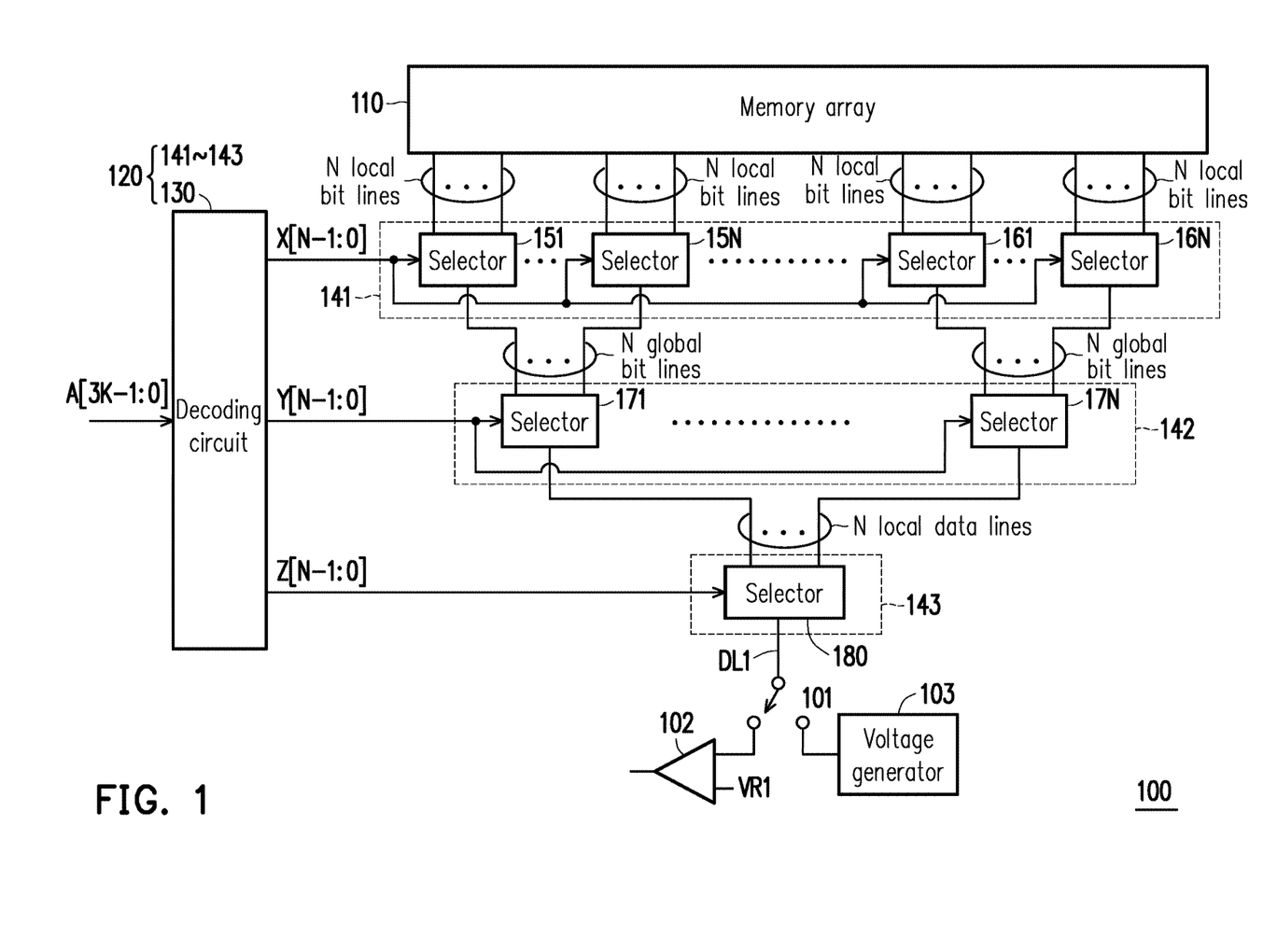
FIG. 1 is a schematic diagram illustrating a memory device according to an embodiment of the invention.

FIG. 1 is a schematic diagram illustrating a memory device according to an embodiment of the invention. Referring to FIG. 1, a memory device 100 includes a memory array 110 and a column decoder 120, and the column decoder 120 includes a decoding circuit 130 and first to third selection circuits 141 to 143. The first to the third selection circuits 141 to 143 are electrically connected in cascade with the memory array 110, so as to be arranged in a hierarchical structure. Additionally, the first selection circuit 141 includes $N^2$ selectors (e.g., selectors 151 to 15N and 161 to 16N), and each of the $N^2$ selectors is electrically connected to N local bit lines. The second selection circuit 142 includes N selectors 171 to 17N, and each of the selectors 171 to 17N is electrically connected to the first selection circuit 141 through N global bit lines. The third selection circuit 143 includes a selector 180. In addition, the selector 180 is electrically connected to a data line DL1, and the selector 180 is electrically connected to the second selection circuit 142 through N local data lines. Moreover, each selector in the first to the third selection circuits 141 to 143 includes N switches. Therein, N is a positive integer, and the number of the switches may be determined according to a selected decoding scheme.

The decoding circuit 130 is electrically connected to the first to the third selection circuits 141 to 143 and receives a column address A[3K−1:0] having (3×K) bits, where $N=2^K$, and K is a positive integer. The decoding circuit 130 decodes the column address A[3K−1:0] into first to third decoded data X[N−1:0], Y[N−1:0] and Z[N−1:0], each of which has N bits for controlling the first to the third selection circuits 141 to 143 respectively. For instance, each selector of the first selection circuit 141 is controlled by the first decoded data X[N−1:0]. Each selector of the second selection circuit 142 is controlled by the second decoded data Y[N−1:0]. The selector 180 of the third selection circuit 143 is controlled by the third decoded data Z[N−1:0].

Under the control of the decoding circuit 130, the first to the third selection circuits 141 to 143 may select a local bit line from the $N^3$ local bit lines connected therewith and conduct the selected local bit line to the data line DL1. Additionally, the memory device 100 may conduct the data line DL1 to a sensing amplifier 102 or a voltage generator 103 in response to a change of a selection switch 101. Thereby, the selected local bit line may be further conducted to the sensing amplifier 102 or the voltage generator 103 through the switching of the selection switch 101, such that the memory device 100 may further perform a predetermined operation (e.g., a reading operation, a verification operation or a programming operation) on the memory array 110.

For instance, when the selected local bit line is conducted to the voltage generator 103 through the selection switch 101, the selected local bit line may be maintained at a high voltage level, such that the memory device 100 may perform a programming operation on the memory array 110. On the other hand, when the selected local bit line is conducted to the sensing amplifier 102 through the selection switch 101, the sensing amplifier 102 may compare a voltage from the selected local bit line with a reference voltage VR1, such that the memory device 100 may perform a reading operation or a verification operation on the memory array 110.

Figure 2:
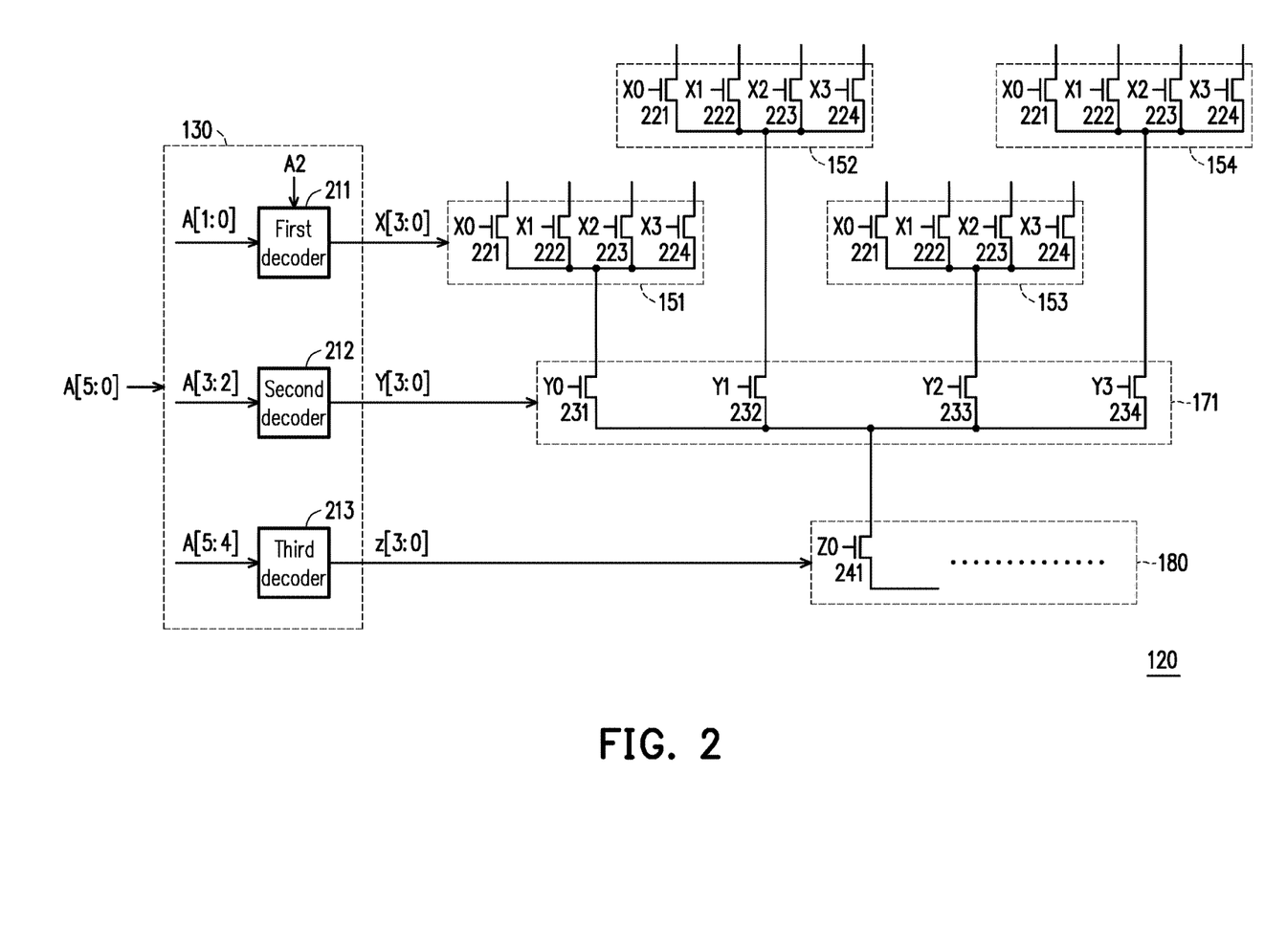
FIG. 2 is a schematic diagram illustrating a part of the column decoder according to an embodiment of the invention.

FIG. 2 is a schematic diagram illustrating a part of the column decoder according to an embodiment of the invention, and for descriptive convenience, a condition that K=2, and N=4 is used for describing the operation of the column decoder in the embodiment illustrated in FIG. 2. Referring to FIG. 2, the decoding circuit 130 includes a first decoder 211, a second decoder 212 and a third decoder 213. Each selector (e.g., each of the selectors 151 to 154) of the first selection circuit 141 includes 4 switches 221 to 224. Each selector (e.g., the selector 171) of the second selection circuit 142 includes 4 switches 231 to 234. The selector 180 of the third selection circuit 143 includes 4 switches, where only a switch 241 of the selector 180 is illustrated in FIG. 2.

A column address A[5:0] received by the decoding circuit 130 includes a first sub-address A[1:0], a second sub-address A[3:2] and a third sub-address A[5:4]. Additionally, the decoding circuit 130 generates first decoded data X[3:0] for controlling the first selection circuit 141 based on the first sub-address A[1:0], generates second decoded data Y[3:0] for controlling the second selection circuit 142 based on the second sub-address A[3:2] and generates third decoded data Z[3:0] for controlling the third selection circuit 143 based on the third sub-address A[5:4].

Specifically, the first decoder 211 further reverses the first decoded data X[3:0] in response to a change of a first predetermined bit A2 of the second sub-address A[3:2]. The first predetermined bit A2 is a least significant bit of the second sub-address A[3:2]. The second decoder 212 decodes the second sub-address A[3:2] into the second decoded data Y[3:0]. The third decoder 213 decodes the third sub-address A[5:4] into the third decoded data Z[3:0].

Figure 3:
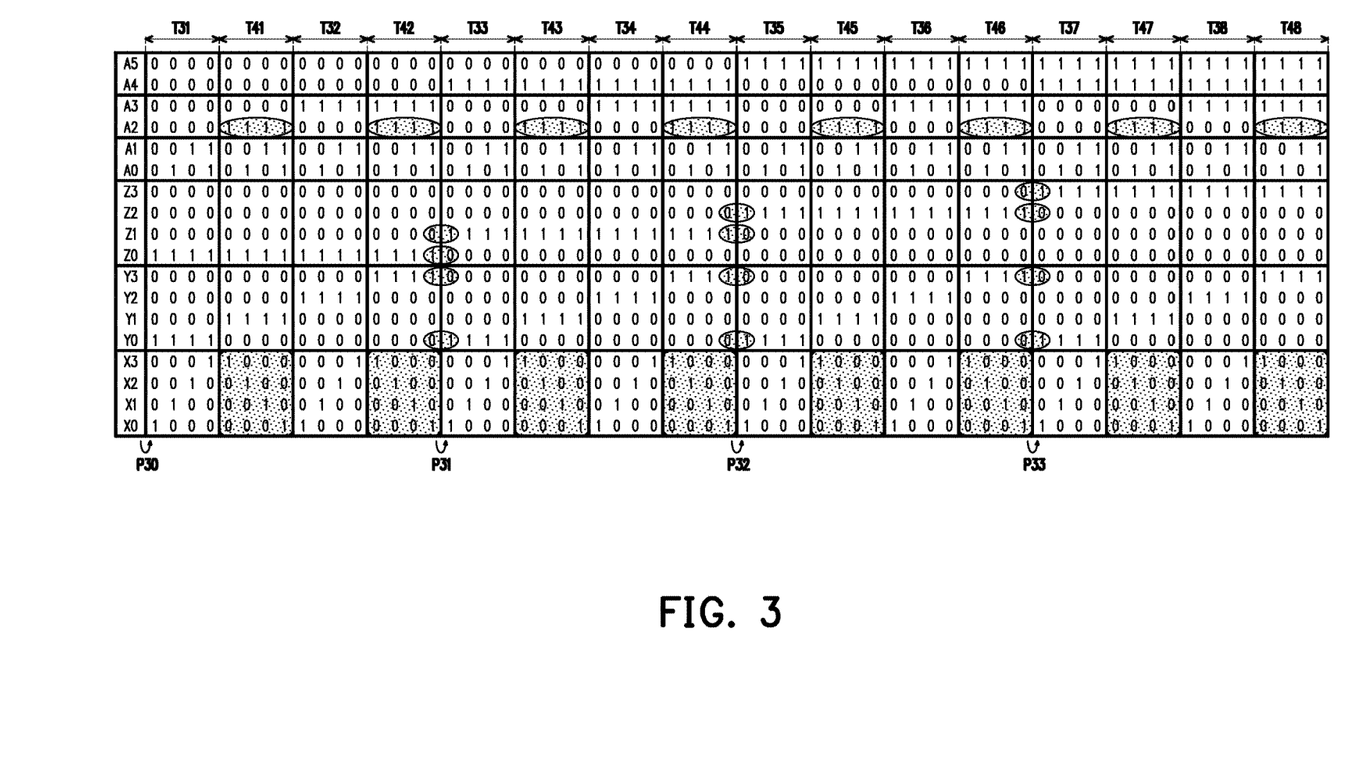
FIG. 3 illustrates a truth table of the decoding circuit according to an embodiment of the invention.

For instance, FIG. 3 illustrates a truth table of the decoding circuit according to an embodiment of the invention. Referring to FIG. 3, a bit value of the column address A[5:0] is gradually accumulated one by one from {000000} to {111111}. As the first decoder 211 is controlled by the first predetermined bit A2, the first decoder 211 may decode and obtain different first decoded data X[3:0] based on the same first sub-address A[1:0]. For instance, in a period T31, i.e., during a process that the first predetermined bit A2 is {0}, and the first sub-address A[1:0] is gradually accumulated one by one from {00} to {11}, the first decoded data X[3:0] decoded and obtained by the first decoder 211 is {0001}, {0010}, {0100} and {1000} respectively. In a period T41, i.e., during a process that the first predetermined bit A2 is {1}, and the first sub-address A[1:0] is gradually accumulated one by one from {00} to {11}, the first decoded data X[3:0] decoded and obtained by the first decoder 211 is {1000}, {0100}, {0010} and {0001} respectively.

In other words, the first decoded data X[3:0] may be reversed in response to a change of a state of the first predetermined bit A2. Thus, in comparison with the first decoded data X[3:0] in the period T31, the first decoder 211 reverses a bit sequence of the first decoded data X[3:0] in the period T41. By deriving in the same way, in periods T32 to T38, the first predetermined bit A2 is {0}, and the first decoded data X[3:0] is {0001}, {0010}, {0100} and {1000} respectively. In periods T42 to T48, the first predetermined bit A2 is {1}, and the first decoder 211 reverses the first decoded data X[3:0], such that the first decoded data X[3:0] is {1000}, {0100}, {0010} and {0001} respectively.

It should be noted that during the process that the column address A[5:0] is gradually accumulated one by one from {000000} to {111111}, the first to the third decoded data X[3:0], Y[3:0] and Z[3:0] are not transited at the same time, and the second decoded data Y[3:0] and the third decoded data Z[3:0] are transited simultaneously only at transient points P30 to P33. For instance, during the process that the column address A[5:0] is changed from {001111} to {010000}, i.e., at the transient point P31, states of two bits Y3 and Y0 in the second decoded data Y[3:0] are changed, and states of two bits Z1 and Z0 in the third decoded data Z[3:0] are changed. In this circumstance, each selector (e.g., the selector 171) of the second selection circuit 142 simultaneously switches states of two switches 234 and 231 therein in response to the transitions of the bits Y3 and Y0. In addition, the selector 180 of the third selection circuit 143 may also simultaneously switch two switches therein.

In other words, during the process that the column address A[5:0] is gradually accumulated one by one from {000000} to {111111}, the number of times that the first to the third decoded data are simultaneously transited is 0, and the number of times that two of the first to the third decoded data are simultaneously transited is 4. Thus, in comparison with the conventional column decoder, the column decoder 120 of the embodiment illustrated in FIG. 2 may prevent the first to the third decoded data from being simultaneously transited and may contribute to reducing the number of times that two of the first to the third decoded data are transited at the same time. In this way, the number of the switches in the first to the third selection circuits 141 to 143 whose states are simultaneously switched may be significantly reduced, so as to reduce switching loss of the first to the third selection circuits 141 to 143. Thereby, power consumption of the column decoder 120 may be reduced, and a decoding speed of the column decoder 120 may be increased. In addition, the column decoder 120 can be prevented from being failed, which contributes to increasing reliability of the column decoder 120.

Figure 4:
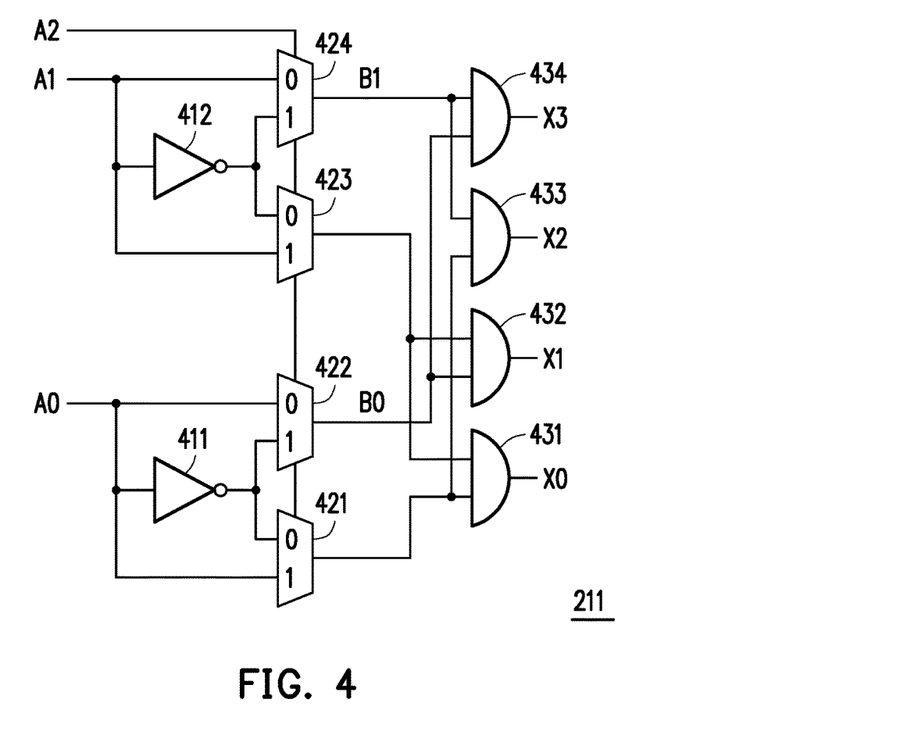
FIG. 4 is a schematic diagram illustrating the first decoder according to an embodiment of the invention.

FIG. 4 is a schematic diagram illustrating the first decoder according to an embodiment of the invention. Referring to FIG. 4, the first decoder 211 includes a first inverter 411 and a second inverter 412, first to fourth multiplexers 421 to 424 and first to fourth AND gates 431 to 434. The first inverter 411 receives a first bit A0 of the first sub-address A[1:0]. The first and the second multiplexers 421 and 422 respectively receive the first bit A0 and an output bit of the first inverter 411. The second inverter 412 receives a second bit A1 of the first sub-address A[1:0]. The third and the fourth multiplexers 423 and 424 respectively receive the second bit A1 and an output bit of the second inverter 412.

Each of the first to the fourth multiplexers 421 to 424 is controlled by the first predetermined bit A2. Thereby, output bits of the first and the second multiplexers 421 and 422 may be inverted to each other, output bits of the third and the fourth multiplexers 423 and 424 may be inverted to each other. The first AND gate 431 is electrically connected to an output terminal of the first multiplexer 421 and an output terminal of the third multiplexer 423 and generates a bit X0 of the first decoded data X[3:0]. The second AND gate 432 is electrically connected to an output terminal of the second multiplexer 422 and the output terminal of the third multiplexer 423 and generates a bit X1 of the first decoded data X[3:0]. The third AND gate 433 is electrically connected to the output terminal of the first multiplexer 421 and the output terminal of the fourth multiplexer 424 and generates a bit X2 of the first decoded data X[3:0]. The fourth AND gate 434 is electrically connected to the output terminal of the second multiplexer 422 and the output terminal of the fourth multiplexer 424 and generates a bit X3 of the first decoded data X[3:0].

Figure 5:
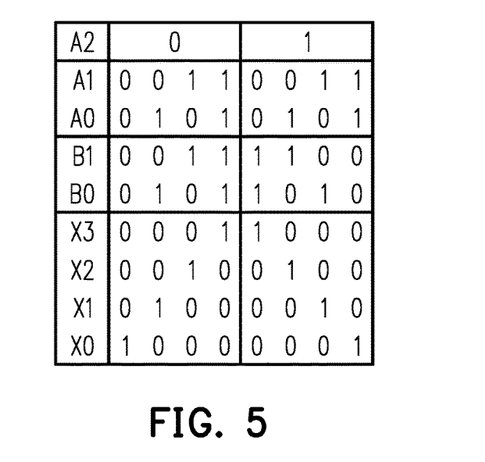
FIG. 5 illustrates a truth table for describing the first decoder according to an embodiment of the invention.

FIG. 5 illustrates a truth table for describing the first decoder according to an embodiment of the invention, in which B0 and B1 respectively represent the output bits of the second and the fourth multiplexers 422 and 424. Referring to FIG. 4 and FIG. 5 simultaneously, the first to the fourth multiplexers 421 to 424 are inserted between the first sub-address A[1:0] and the first to the fourth AND gates 431 to 434. Additionally, the first to the fourth multiplexers 421 to 424 may adjust the output bits thereof in response to the first predetermined bit A2, and the first to the fourth AND gates 431 to 434 may generate the first decoded data X[3:0] in response to the output bits of the first to the fourth multiplexers 421 to 424. Thereby, the first predetermined bit A2 may be regarded as reversed information of the first decoder 211. For instance, when the first predetermined bit A2 is {0}, and the first sub-address A[1:0] is {00}, {01}, {10} and {11} respectively, the first decoded data X[3:0] may be {0001}, {0010}, {0100} and {1000} respectively. On the other hand, when the first predetermined bit A2 is {1}, and the first sub-address A[1:0] is {00}, {01}, {10} and {11} respectively, the first decoded data X[3:0] may be {1000}, {0100}, {0010} and {0001} respectively.

Figure 6:
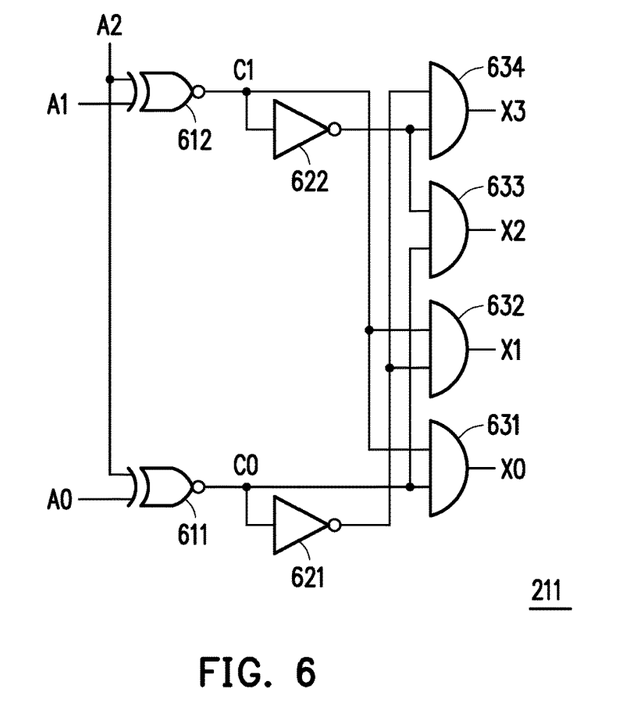
FIG. 6 is a schematic diagram illustrating the first decoder according to another embodiment of the invention.

FIG. 6 is a schematic diagram illustrating the first decoder according to another embodiment of the invention. Referring to FIG. 6, the first decoder 211 includes first and second XNOR gates 611 and 612, first and second inverters 621 and 622 and first to fourth AND gates 631 to 634. The first XNOR gate 611 receives the first bit A0 of the first sub-address A[1:0] and the first predetermined bit A2. The second XNOR gate 612 receives the second bit A1 of the first sub-address A[1:0] and the first predetermined bit A2.

The first inverter 621 is electrically connected to an output terminal of the first XNOR gate 611. The second inverter 622 is electrically connected to an output terminal of the second XNOR gate 612. The first AND gate 631 is electrically connected to the output terminal of the first XNOR gate 611 and the output terminal of the second XNOR gate 612. The second AND gate 632 is electrically connected to the output terminal of the second XNOR gate 612 and an output terminal of the first inverter 621. The third AND gate 633 is electrically connected to the output terminal of the first XNOR gate 611 and an output terminal of the second inverter 622. The fourth AND gate 634 is electrically connected to the output terminal of the first inverter 621 and the output terminal of the second inverter 622. In addition, the first to the fourth AND gates 631 to 634 generate the first decoded data X[3:0].

Figure 7:
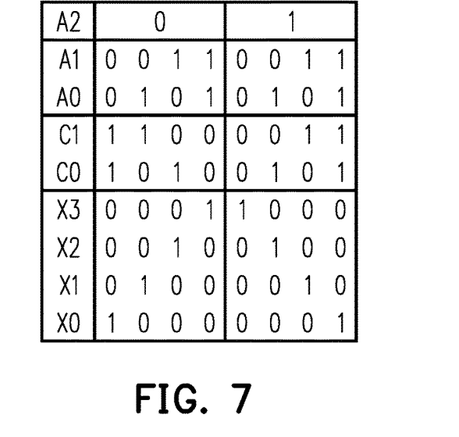
FIG. 7 illustrates a truth table for describing the first decoder according to another embodiment of the invention.

FIG. 7 illustrates a truth table for describing the first decoder according to another embodiment of the invention, in which C0 and C1 respectively represent output bits of the first and the second XNOR gates 611 and 612. Referring to FIG. 6 and FIG. 7 simultaneously, under the control of the first predetermined bit A2, the first and the second XNOR gates 611 and 612 may directly output the first sub-address A[1:0] or generate an inverted signal of the first sub-address A[1:0]. Thereby, the first predetermined bit A2 may be regarded as reversed information of the first decoder 211. For example, when first predetermined bit A2 is {0}, and the first sub-address A[1:0] is {00}, {01}, {10} and {11} respectively, the first decoded data X[3:0] may be {0001}, {0010}, {0100} and {1000} respectively. On the other hand, when the first predetermined bit A2 is {1}, and the first sub-address A[1:0] is {00}, {01}, {10} and {11} respectively, the first decoded data X[3:0] may be {1000}, {0100}, {0010} and {0001} respectively.

Figure 8:
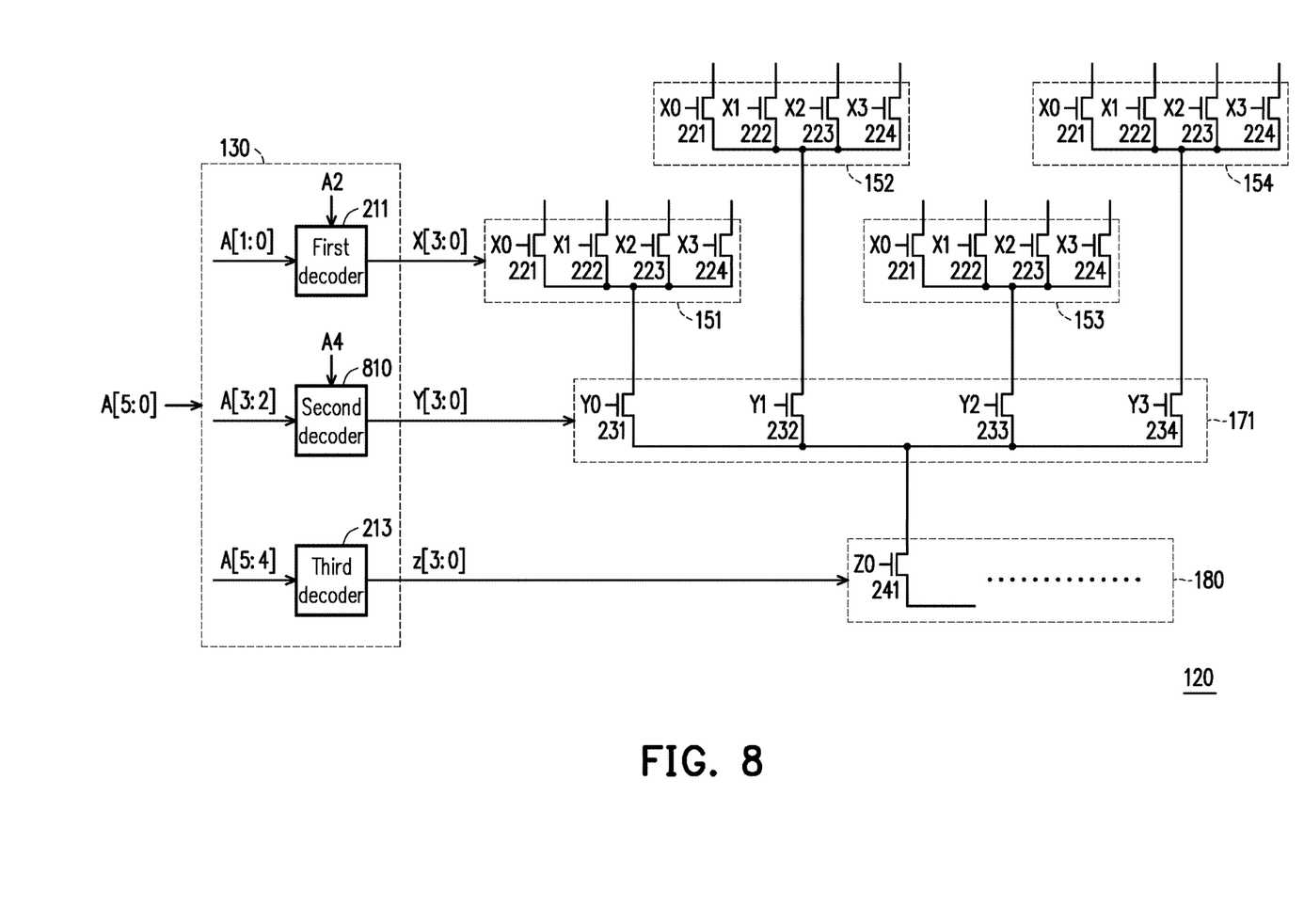
FIG. 8 is a schematic diagram illustrating a part of the column decoder according to another embodiment of the invention.

FIG. 8 is a schematic diagram illustrating a part of the column decoder according to another embodiment of the invention. In comparison with the embodiment illustrated in FIG. 2, a second decoder 810 of the decoding circuit 130 illustrated in FIG. 8 is different from the second decoder 212 illustrated in FIG. 2. Specifically, the second decoder 810 further reverses the second decoded data Y[3:0] in response to a change of a second predetermined bit A4 of the third sub-address A[5:4]. In addition, the second predetermined bit A4 is a least significant bit of the third sub-address A[5:4].

Figure 9:
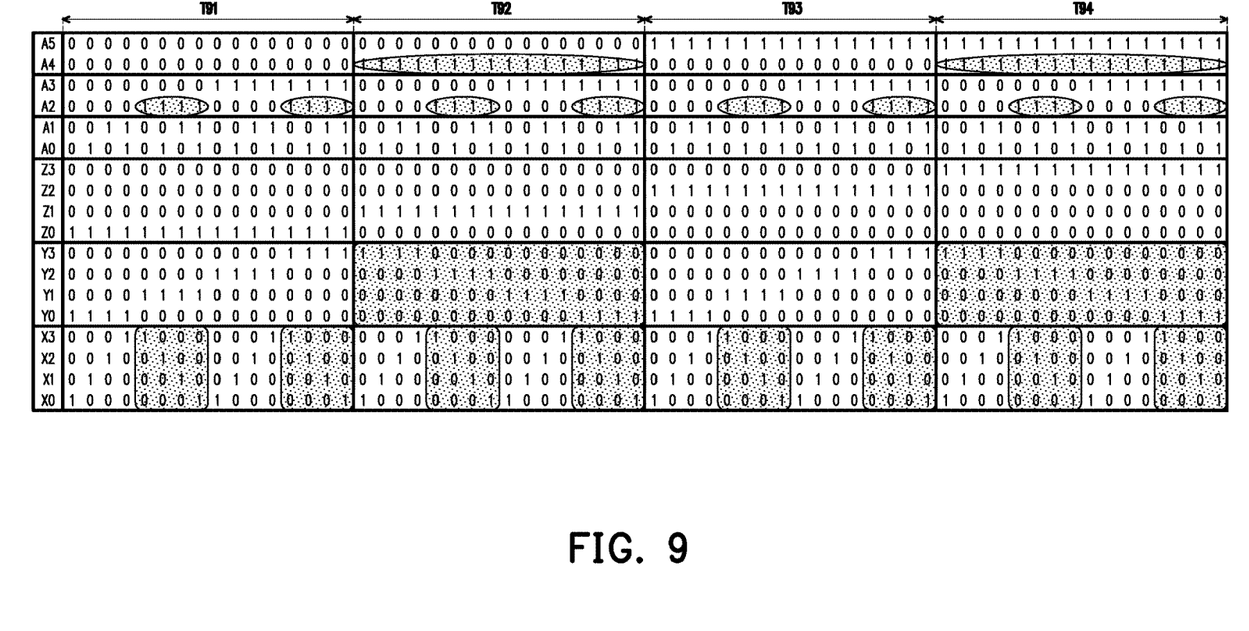
FIG. 9 illustrates a truth table of the decoding circuit according to another embodiment of the invention.

For instance, FIG. 9 illustrates a truth table of the decoding circuit according to another embodiment of the invention. Referring to FIG. 9, the bit value of the column address A[5:0] is gradually accumulated one by one from {000000} to {111111}. As the second decoder 810 is controlled by the second predetermined bit A4, the second decoder 810 may decode and obtain different second decoded data Y[3:0] based on the same second sub-address A[3:2]. For instance, in periods T91 and T93, i.e., during a process that the second predetermined bit A4 is {0}, and the second sub-address A[3:2] is {00}, {01}, {10} and {11} respectively, the second decoded data Y[3:0] decoded by the second decoder 810 may be {0001}, {0010}, {0100} and {1000} respectively. On the other hand, in periods T92 and T94, i.e., during a process that the second predetermined bit A4 is {1}, and the second sub-address A[3:2] is {00}, {01}, {10} and {11} respectively, the second decoded data Y[3:0] decoded by the second decoder 810 may be {1000}, {0100}, {0010} and {0001} respectively.

In other words, by being compared with the second decoded data Y[3:0] in the periods T91 and T93, the second decoder 810 reverses a bit sequence of the second decoded data Y[3:0] in the periods T92 and T94. In addition, in the similar way to the embodiment illustrated in FIG. 2, in the periods T91 to T94, the first decoder 211 may determine whether to reverse the first decoded data X[3:0] based on the first predetermined bit A2. In this way, during the process that the column address A[5:0] is gradually accumulated one by one from {000000} to {111111}, i.e., in the periods T91 to T94, any two of the first to the third decoded data X[3:0], Y[3:0] and Z[3:0] are not transited at the same time.

In this way, as for the embodiment illustrated in FIG. 8, during the process that the column address A[5:0] is gradually accumulated one by one from {000000} to {111111}, the number of times that the first to the third decoded data are simultaneously transited is 0, and the number of times that two of the first to the third decoded data are simultaneously transited is also 0. In other words, when one of the first to the third decoded data is transited, the other two decoded data remain unchanged. Thereby, the power consumption of the column decoder 120 may be reduced, and the decoding speed and the reliability of the column decoder 120 may be increased. Detailed configurations and operations of the other elements of the embodiment illustrated in FIG. 8 may refer to the embodiments that have been described above and thus, will not be repeated.

Figure 10:
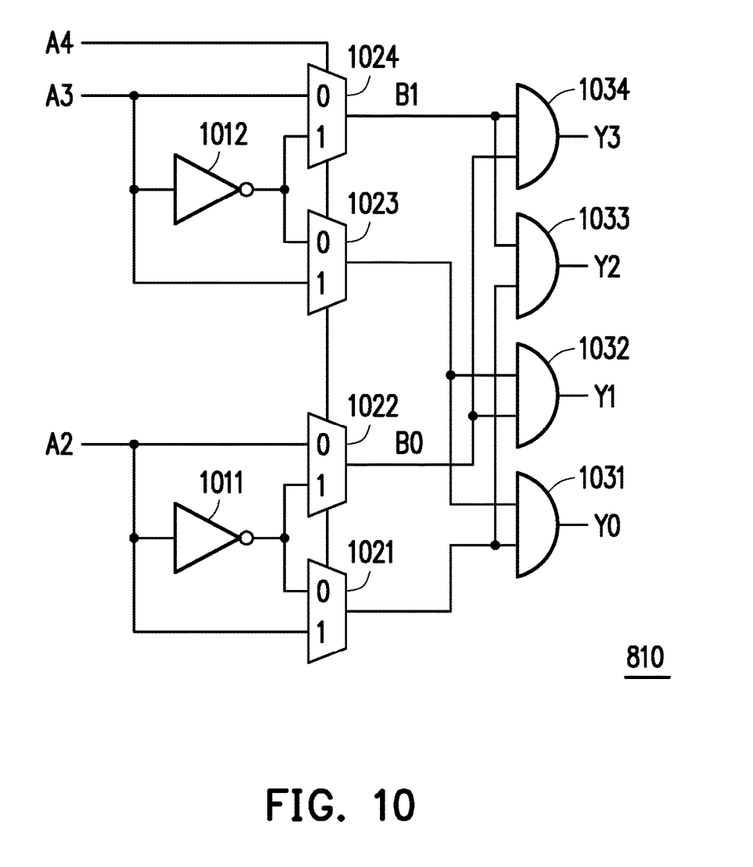
FIG. 10 is a schematic diagram illustrating the second decoder according to an embodiment of the invention.

FIG. 10 is a schematic diagram illustrating the second decoder according to an embodiment of the invention. Referring to FIG. 10, the second decoder 810 includes first and second inverters 1011 and 1012, first to fourth multiplexers 1021 to 1024 and first to fourth AND gates 1031 to 1034. The first inverter 1011 receives a first bit A2 (i.e., a least significant bit) of the second sub-address A[3:2]. The first and the second multiplexers 1021 and 1022 respectively receive the first bit A2 and an output bit of the first inverter 1011. The second inverter 1012 receives a second bit A3 of the second sub-address A[3:2]. The third and the fourth multiplexers 1023 and 1024 respectively receive the second bit A3 and an output bit of the second inverter 1012.

The first to the fourth multiplexers 1021 to 1024 are respectively controlled by the second predetermined bit A4. Thereby, output bits of the first and the second multiplexers 1021 and 1022 may be inverted to each other, and output bits of the third and the fourth multiplexers 1023 and 1024 may be inverted to each other. The first AND gate 1031 is electrically connected to an output terminal of the first multiplexer 1021 and an output terminal of the third multiplexer 1023. The second AND gate 1032 is electrically connected to an output terminal of the second multiplexer 1022 and the output terminal of the third multiplexer 1023. The third AND gate 1033 is electrically connected to the output terminal of the first multiplexer 1021 and an output terminal of the fourth multiplexer 1024. The fourth AND gate 1034 is electrically connected to the output terminal of the second multiplexer 1022 and the output terminal of the fourth multiplexer 1024. The first to the fourth AND gates 1031 to 1034 generate the second decoded data Y[3:0]. In addition, the operation of the second decoder of the embodiment illustrated in FIG. 10 is similar to the operation of the first decoder of the embodiment illustrated in FIG. 4 and thus, will not be repeated.

Figure 11:
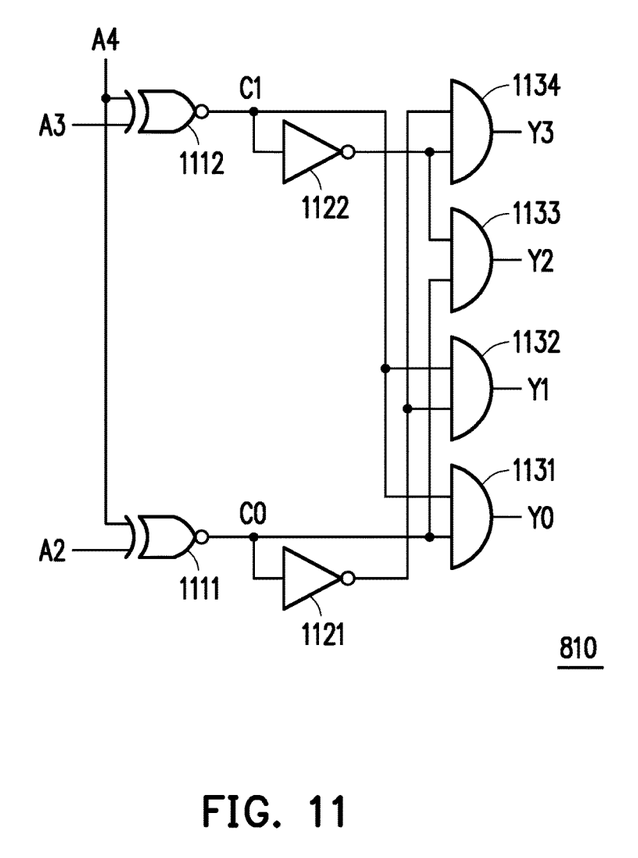
FIG. 11 is a schematic diagram illustrating the second decoder according to another embodiment of the invention.

FIG. 11 is a schematic diagram illustrating the second decoder according to another embodiment of the invention. Referring to FIG. 11, the second decoder 810 includes first and second XNOR gates 1111 and 1112, first and second inverters 1121 and 1122 and first to fourth AND gates 1131 to 1134. The first XNOR gate 1111 receives the first bit A2 (i.e., the least significant bit) of the second sub-address A[3:2] and the second predetermined bit A4. The second XNOR gate 1112 receives the second bit A3 of the second sub-address A[3:2] and the second predetermined bit A4. The first inverter 1121 is electrically connected to an output terminal of the first XNOR gate 1111. The second inverter 1122 is electrically connected to an output terminal of the second XNOR gate 1112.

The first AND gate 1131 is electrically connected to the output terminal of the first XNOR gate 1111 and the output terminal of the second XNOR gate 1112. The second AND gate 1132 is electrically connected to the output terminal of the second XNOR gate 1112 and an output terminal of the first inverter 1121. The third AND gate 1133 is electrically connected to the output terminal of the first XNOR gate 1111 and an output terminal of the second inverter 1122. The fourth AND gate 1134 is electrically connected to the output terminal of the first inverter 1121 and the output terminal of the second inverter 1122. The first to the fourth AND gate 1131 to 1134 generate the second decoded data Y[3:0]. In addition, the operation of the second decoder of the embodiment illustrated in FIG. 11 is similar to the operation of the first decoder of the embodiment illustrated in FIG. 6 and thus, will not be repeated.

In light of the foregoing, the decoding circuit of the column decoder of the invention can receive a column address including M sub-addresses, and $(i-1)^{th}$ decoded data generated by an $(i-1)^{th}$ decoder of the decoding circuit can not only be based on an $(i-1)^{th}$ sub-address, but also be reversed in response to a change of a predetermined bit (e.g., a least significant bit) of an $i^{th}$ sub-address. Namely, in response to the change of the predetermined bit of the $i^{th}$ sub-address, the $(i-1)^{th}$ decoder of the decoding circuit outputs the reversed (i−1)$^{th}$ decoded data. Therein, i is a positive integer greater than 1 and less than M. Thereby, the power consumption of the column decoder can be reduced, and the decoding speed and the reliability of the column decoder can be increased.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A column decoder of a memory device, comprising:
    a first selection circuit and a second selection circuit, electrically connected in cascade with a memory array in the memory device; and
    a decoding circuit, electrically connected to the first selection circuit and the second selection circuit, receiving a column address comprising a first sub-address and a second sub-address, generating first decoded data for controlling the first selection circuit based on the first sub-address and generating second decoded data for controlling the second selection circuit based on the second sub-address, wherein the decoding circuit comprises:
        a first decoder, decoding the first sub-address into the first decoded data, wherein the first decoded data is reversed in response to a change of a first predetermined bit of the second sub-address.

2. The column decoder of the memory device according to claim 1, wherein the first predetermined bit is a least significant bit of the second sub-address.

3. The column decoder of the memory device according to claim 2, wherein the first decoder comprises:
    a first inverter, receiving a first bit of the first sub-address;
    a second inverter, receiving a second bit of the first sub-address;
    a first multiplexer and a second multiplexer, respectively receiving the first bit and an output bit of the first inverter, wherein the first multiplexer and the second multiplexer are respectively controlled by the first predetermined bit, and an output bit of the first multiplexer and an output bit of the second multiplexer are inverted to each other;
    a third multiplexer and a fourth multiplexer, respectively receiving the second bit and an output bit of the second inverter, wherein the third multiplexer and the fourth multiplexer are respectively controlled by the first predetermined bit, and an output bit of the third multiplexer and an output bit of the fourth multiplexer are inverted to each other;
    a first AND gate, electrically connected to an output terminal of the first multiplexer and an output terminal of the third multiplexer;
    a second AND gate, electrically connected to an output terminal of the second multiplexer and the output terminal of the third multiplexer;
    a third AND gate, electrically connected to the output terminal of the first multiplexer and an output terminal of the fourth multiplexer; and
    a fourth AND gate, electrically connected to the output terminal of the second multiplexer and the output terminal of the fourth multiplexer, wherein the first AND gate through the fourth AND gate generate the first decoded data.

4. The column decoder of the memory device according to claim 2, wherein the first decoder comprises:
    a first XNOR gate, receiving a first bit of the first sub-address and the first predetermined bit;
    a second XNOR gate, receiving a second bit of the first sub-address and the first predetermined bit;
    a first inverter, electrically connected to an output terminal of the first XNOR gate;
    a second inverter, electrically connected to an output terminal of the second XNOR gate;
    a first AND gate, electrically connected to the output terminal of the first XNOR gate and the output terminal of the second XNOR gate;
    a second AND gate, electrically connected to the output terminal of the second XNOR gate and an output terminal of the first inverter;
    a third AND gate, electrically connected to the output terminal of the first XNOR gate and an output terminal of the second inverter; and
    a fourth AND gate, electrically connected to the output terminal of the first inverter and the output terminal of the second inverter, wherein the first AND gate through the fourth AND gate generate the first decoded data.

5. The column decoder of the memory device according to claim 2, further comprising a third selection circuit electrically connected to the decoding circuit and electrically connected to the first selection circuit through the second selection circuit, wherein the column address further comprises a third sub-address, the decoding circuit further generates third decoded data for controlling the third selection circuit based on the third sub-address, and the decoding circuit further comprises:
    a second decoder, decoding the second sub-address into the second decoded data; and
    a third decoder, decoding the third sub-address into the third decoded data.

6. The column decoder of the memory device according to claim 5, wherein the column address has (3×K) bits, $N^2$ selectors of the first selection circuit are respectively controlled by the first decoded data, N selectors of the second selection circuit are respectively controlled by the second decoded data, a selector of the third selection circuit is controlled by the third decoded data, and the $N^2$ selectors of the first selection circuit, the N selectors of the second selection circuit and the selector of the third selection circuit respectively comprise N switches, wherein $N=2^K$, and K is a positive integer.

7. The column decoder of the memory device according to claim 6, wherein each of the $N^2$ selectors of the first selection circuit is electrically connected to N local bit lines of the memory array, the selector of the third selection circuit is electrically connected to a selection switch of the memory device through a data line, and the memory device conducts the data line to a sensing amplifier or a voltage generator in response to switching of the selection switch.

8. The column decoder of the memory device according to claim 5, wherein the second decoder decodes the second sub-address into the second decoded data, and the second decoded data is reversed in response to a change of a second predetermined bit of the third sub-address.

9. The column decoder of the memory device according to claim 8, wherein the second predetermined bit is a least significant bit of the third sub-address.

10. The column decoder of the memory device according to claim 8, wherein the second decoder comprises:
    a first inverter, receiving a first bit of the second sub-address;

a second inverter, receiving a second bit of the second sub-address;

a first multiplexer and a second multiplexer, respectively receiving the first bit and an output bit of the first inverter, wherein the first multiplexer and the second multiplexer are respectively controlled by the second predetermined bit, and an output bit of the first multiplexer and an output bit of the second multiplexer are inverted to each other;

a third multiplexer and a fourth multiplexer, respectively receiving the second bit and an output bit of the second inverter, wherein the third multiplexer and the fourth multiplexer are respectively controlled by the second predetermined bit, and an output bit of the third multiplexer and an output bit of the fourth multiplexer are inverted to each other;

a first AND gate, electrically connected to an output terminal of the first multiplexer and an output terminal of the third multiplexer;

a second AND gate, electrically connected to an output terminal of the second multiplexer and the output terminal of the third multiplexer;

a third AND gate, electrically connected to the output terminal of the first multiplexer and an output terminal of the fourth multiplexer; and a fourth AND gate, electrically connected to the output terminal of the second multiplexer and the output terminal of the fourth multiplexer, wherein the first AND gate through the fourth AND gate generate the second decoded data.

11. The column decoder of the memory device according to claim 8, wherein the second decoder comprises:

a first XNOR gate, receiving a first bit of the second sub-address and the second predetermined bit;

a second XNOR gate, receiving a second bit of the second sub-address and the second predetermined bit;

a first inverter, electrically connected to an output terminal of the first XNOR gate;

a second inverter, electrically connected to an output terminal of the second XNOR gate;

a first AND gate, electrically connected to the output terminal of the first XNOR gate and the output terminal of the second XNOR gate;

a second AND gate, electrically connected to the output terminal of the second XNOR gate and an output terminal of the first inverter;

a third AND gate, electrically connected to the output terminal of the first XNOR gate and an output terminal of the second inverter; and a fourth AND gate, electrically connected to the output terminal of the first inverter and the output terminal of the second inverter, and the first AND gate through the fourth AND gate generate the second decoded data.

* * * * *